(12) United States Patent
Lin et al.

(10) Patent No.: US 12,532,497 B2
(45) Date of Patent: Jan. 20, 2026

(54) HIGH ELECTRON MOBILITY TRANSISTOR STRUCTURE AND FABRICATION METHOD THEREOF

(71) Applicant: Vanguard International Semiconductor Corporation, Hsinchu (TW)

(72) Inventors: Shin-Cheng Lin, Hsinchu County (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 441 days.

(21) Appl. No.: 18/098,079

(22) Filed: Jan. 17, 2023

(65) Prior Publication Data
US 2024/0243194 A1 Jul. 18, 2024

(51) Int. Cl.
| | |
|---|---|
| H10D 30/47 | (2025.01) |
| H10D 30/01 | (2025.01) |
| H10D 64/01 | (2025.01) |
| H10D 64/23 | (2025.01) |
| H10D 64/27 | (2025.01) |

(52) U.S. Cl.
CPC ......... H10D 30/475 (2025.01); H10D 30/015 (2025.01); H10D 64/01 (2025.01); H10D 64/258 (2025.01); H10D 64/411 (2025.01)

(58) Field of Classification Search
CPC ....... H10D 30/015; H10D 30/471–478; H10D 62/126; H10D 62/343; H10D 62/854; H10D 64/01; H10D 64/258; H10D 64/411
See application file for complete search history.

(56) References Cited

U.S. PATENT DOCUMENTS

| | | | | |
|---|---|---|---|---|
| 6,982,204 | B2* | 1/2006 | Saxler ................. | H10D 30/015 |
| | | | | 257/E29.253 |
| 7,964,896 | B2* | 6/2011 | Kiewra .............. | H10D 30/4755 |
| | | | | 257/E21.409 |
| 8,278,688 | B2* | 10/2012 | Ohki .................. | H10D 30/4755 |
| | | | | 257/192 |
| 2007/0018199 | A1* | 1/2007 | Sheppard ............ | H10D 30/015 |
| | | | | 257/E29.127 |
| 2013/0032816 | A1* | 2/2013 | Hwang .............. | H10D 62/8503 |
| | | | | 257/E21.403 |
| 2015/0270379 | A1* | 9/2015 | Kuraguchi .......... | H10D 62/106 |
| | | | | 257/194 |
| 2016/0071951 | A1* | 3/2016 | Mishra ............... | H10D 30/4732 |
| | | | | 438/285 |
| 2018/0138306 | A1* | 5/2018 | Jeon ................... | H10D 30/4755 |

* cited by examiner

*Primary Examiner* — Andres Munoz
(74) *Attorney, Agent, or Firm* — Winston Hsu

(57) ABSTRACT

A high electron mobility transistor structure includes a compound semiconductor channel layer disposed on a substrate, a compound semiconductor barrier layer disposed on the compound semiconductor channel layer, and a compound semiconductor cap layer disposed on the compound semiconductor barrier layer. The compound semiconductor cap layer includes a first segment and a second segment arranged along a first direction, and a gap between the first segment and the second segment. A gate electrode is disposed on the compound semiconductor cap layer. A source electrode and a drain electrode are disposed on the compound semiconductor barrier layer, arranged along a second direction and respectively located on two sides of the compound semiconductor cap layer.

15 Claims, 7 Drawing Sheets

HIGH ELECTRON MOBILITY TRANSISTOR STRUCTURE AND FABRICATION METHOD THEREOF

BACKGROUND OF THE INVENTION

1. Field of the Invention

The present disclosure relates generally to semiconductor devices, and more particularly to a high electron mobility transistor (HEMT) structure integrating an enhancement-mode HEMT and a depletion-mode HEMT and a fabrication method thereof.

2. Description of the Prior Art

In the applications of AC/DC power converters and drivers, junction field-effect transistors (JFETs) or depletion-mode field-effect transistors (D-mode FETs) are usually used to provide start-up function. However, the conventional JFETs require a well region to pinch-off the voltage, and the well region is most likely varied by the fabrication process, which easily leads to a shift in the pinch-off voltage. In addition, a gate structure of the conventional D-mode FETs such as depletion mode metal-insulator-semiconductor field effect transistors (D-mode MISFETs) requires forming a gate recess. However, the etching depth of the gate recess is not easy to be precisely controlled, which leads to instability of the threshold voltage (Vt) of the D-mode MISFETs. In addition, interface traps are usually produced between the gate dielectric layer and the semiconductor layer of the D-mode MISFETs, thereby reducing the reliability of the D-mode MISFETs.

SUMMARY OF THE INVENTION

In view of this, the present disclosure provides a high electron mobility transistor (HEMT) structure and a fabrication method thereof. The HEMT structure integrates an enhancement-mode (E-mode) HEMT and a depletion-mode (D-mode) HEMT, and the fabrication method thereof does not require additional process steps. A layout of a compound semiconductor cap layer of the HEMT structure is used to achieve the effect of lateral depletion, so that the HEMT structures of the present disclosure provide a start-up function. Moreover, through adjusting the width of a gap between segments of the compound semiconductor cap layer, the threshold voltage (Vt) of the D-mode HEMT is precisely controlled, so that the HEMT structures of the present disclosure have stable and precise electrical characteristics.

According to one embodiment of the present disclosure, a high electron mobility transistor structure is provided and includes a substrate, a compound semiconductor channel layer, a compound semiconductor barrier layer, a compound semiconductor cap layer, a gate electrode, a source electrode and a drain electrode. The compound semiconductor channel layer is disposed on the substrate. The compound semiconductor barrier layer is disposed on the compound semiconductor channel layer. The compound semiconductor cap layer is disposed on the compound semiconductor barrier layer. Moreover, the compound semiconductor cap layer includes a first segment and a second segment arranged along a first direction, and there is a first gap between the first segment and the second segment. The gate electrode is disposed on the compound semiconductor cap layer. The source electrode and the drain electrode are disposed on the compound semiconductor barrier layer, arranged along a second direction, and respectively located on two opposite sides of the compound semiconductor cap layer.

According to one embodiment of the present disclosure, a fabrication method of a high electron mobility transistor structure is provided and includes the following steps. A compound semiconductor channel layer is formed on a substrate. A compound semiconductor barrier layer is formed on the compound semiconductor channel layer. A compound semiconductor cap layer is formed on the compound semiconductor barrier layer. The compound semiconductor cap layer includes a first segment and a second segment arranged along a first direction, and there is a first gap between the first segment and the second segment. A gate electrode is formed on the compound semiconductor cap layer. In addition, a source electrode and a drain electrode are formed on the compound semiconductor barrier layer. The source electrode and the drain electrode are arranged along a second direction, and respectively located on two opposite sides of the compound semiconductor cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
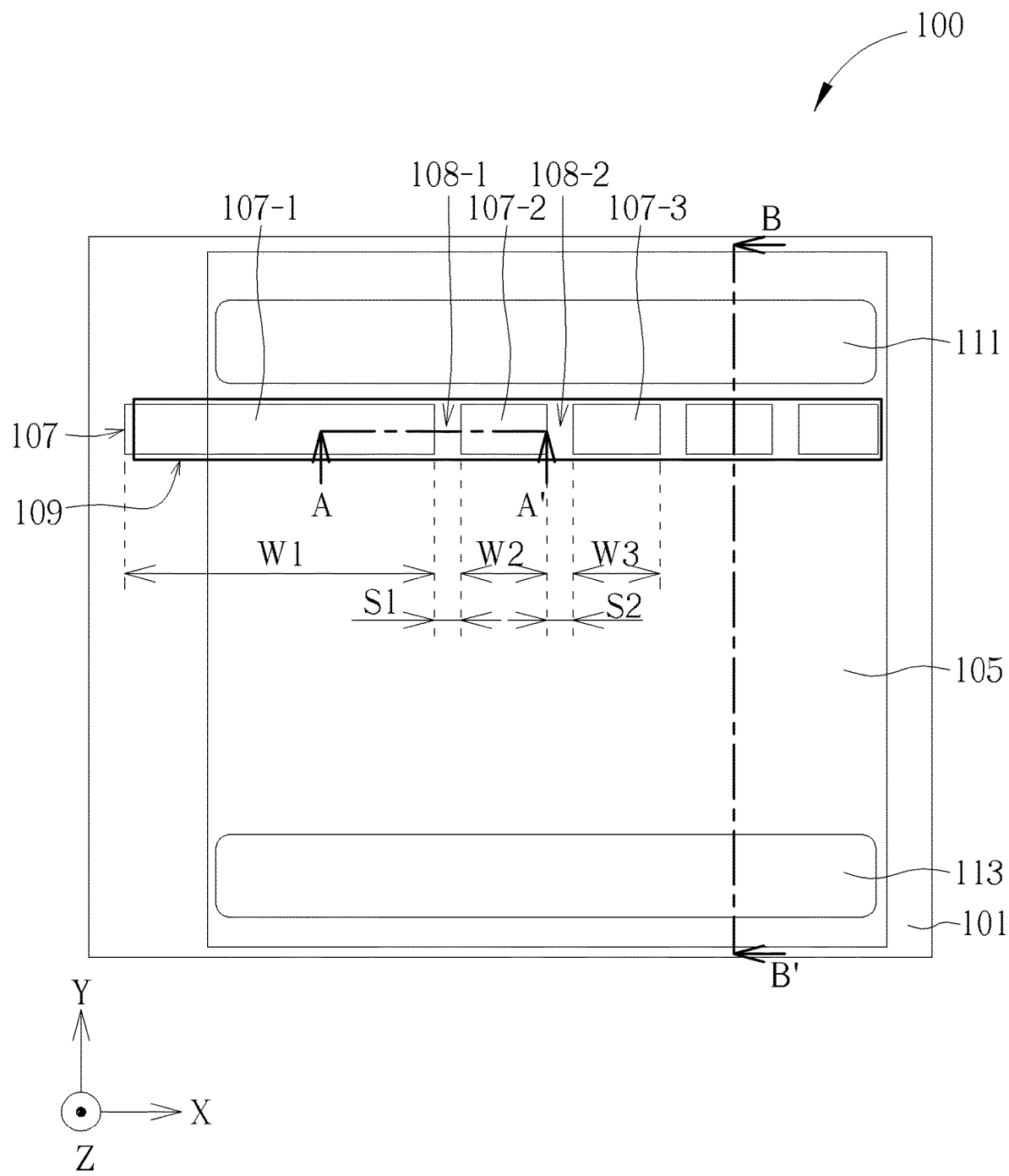
FIG. 1 is a schematic top view of a high electron mobility transistor (HEMT) structure according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "compound semiconductor" refers to a group III-V compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V compound semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a high electron mobility transistor (HEMT) structure integrating an enhancement-mode (E-mode) HEMT and a depletion-mode (D-mode) HEMT and a fabrication method thereof. Through the layout of a compound semiconductor cap layer, the HEMT structure does not require additional process steps to achieve the effect of lateral depletion. Accordingly, the HEMT structures of the present disclosure provide a start-up function. Moreover, the threshold voltage (Vt) of the D-mode HEMT is precisely controlled by adjusting the width of a gap between segments of the compound semiconductor cap layer. When compared with the conventional depletion-mode metal-insulator-semiconductor field-effect transistors (D-mode MISFETs), the threshold voltage (Vt) of the D-mode HEMT of the HEMT structures of the present disclosure is stably and accurately controlled, so that the pinch-off voltage of the HEMT structures of the present disclosure is precisely controlled while providing a start-up function. Moreover, the interface trap between the gate dielectric layer and the semiconductor layer of the conventional D-mode MISFETs is overcome by the present disclosure, thereby improving the reliability of the HEMT structures.

FIG. 1 is a schematic top view of a HEMT structure according to an embodiment of the present disclosure. The HEMT structure 100 includes a substrate 101. In some embodiments, the material of the substrate 101 may include ceramics, silicon carbide (SiC), aluminum nitride (AlN), sapphire or silicon. When the substrate 101 is made of a material with high hardness, high thermal conductivity and low electrical conductivity, such as a ceramic substrate, it is more suitable for high-voltage semiconductor devices. The aforementioned high hardness, high thermal conductivity and low electrical conductivity of the substrate 101 are compared with a single-crystal silicon substrate, and the high-voltage semiconductor devices refer to semiconductor devices with an operating voltage higher than 50V. In some embodiments, the substrate 101 may be a semiconductor-on-insulator (SOI) substrate. In some other embodiments, the substrate 101 may be provided by a composite substrate (or referred to as a QST substrate) composed of a core substrate wrapped around by a composite material layer. The core substrate includes ceramics, silicon carbide, aluminum nitride, sapphire or silicon. The composite material layer includes an insulating material layer and a semiconductor material layer. The insulating material layer may be single or multiple layers of silicon oxide, silicon nitride or silicon oxynitride. The semiconductor material layer may be silicon or polysilicon. In addition, during the fabrication of the HEMT structures, the composite material layer located on the backside of the core substrate may be removed by a thinning process, such as a grinding or etching process, so that the backside of the core substrate is exposed.

Still referring to FIG. 1, from a top view, the HEMT structure 100 includes a compound semiconductor barrier layer 105 (hereinafter referred to as a barrier layer) disposed on the substrate 101, and a compound semiconductor cap layer 107 (hereinafter referred to as a cap layer) disposed on the barrier layer 105. In some embodiments of the present disclosure, the cap layer 107 includes a plurality of segments, such as a first segment 107-1, a second segment 107-2, a third segment 107-3, etc. Although five segments are shown in FIG. 1, more or fewer segments may be provided for the cap layer 107 based on various requirements of the HEMT structure 100. These segments of the cap layer 107 are arranged along a first direction (for example, the X-axis direction), and these segments are separated from each other with respective gaps. For example, there is a first gap 108-1 between the first segment 107-1 and the second segment 107-2. A second gap 108-2 is between the second segment 107-2 and the third segment 107-3, and so on. In some embodiments, a partial surface of the barrier layer 105 is exposed through the first gap 108-1, the second gap 108-2 and other gaps. According to the embodiments of the present disclosure, the widths of the first gap 108-1, the second gap 108-2 and other gaps in the first direction (for example, the X-axis direction), such as a first gap width S1, a second gap width S2, and other gap widths may be in a range from about 0.01 micrometers (μm) to about 1 μm. Moreover, the first gap width S1, the second gap width S2 and other gap widths may be the same as or different from each other based on the electrical requirements of the HEMT structure 100. The gap widths within this range make the HEMT structure 100 achieve the required effect of lateral depletion.

In addition, according to some embodiments of the present disclosure, the range of the widths of the first segment 107-1, the second segment 107-2, the third segment 107-3 and other segments in the first direction (for example, the X-axis direction), such as a first segment width W1, a second segment width W2, a third segment width W3 and other segment widths are determined by the range of the first gap width S1, the second gap width S2 and other gap widths. When the gap width is smaller, the ratio of the segment width to the gap width may be smaller. When each gap width is less than 1 μm, the effect of required lateral depletion achieved by the HEMT structure 100 is better, and the device of the HEMT structure 100 is turned off. In some embodiments, each gap width is, for example, from about 0.01 μm to about 0.5 μm, and the ratio of each segment width to each gap width is about 5 to 200, so that the HEMT structure 100 achieves the effect of lateral depletion to quickly turn off the device thereof. In one embodiment, when the gap width is about 0.4 μm, the ratio of the segment width to the gap width is about 5 to turn off the device, and the segment width is about 2.0 μm. In another embodiment, when the gap width is about 0.5 μm, the ratio of the segment width to the gap width is about 179 to turn off the device, and the segment width is about 89.5 μm. In addition, when each gap width is smaller and each segment width is larger, the ratio of the segment width to the gap width is larger. In these conditions, the HEMT structure 100 achieves the effect of lateral depletion faster and the device is turned off faster, so that the required threshold voltage (Vt) is smaller. Moreover, the magnitude of the threshold voltage (Vt) may also be adjusted according to the requirements of applications, as long as the device is turn-off.

In some embodiments, the first segment width W1, the second segment width W2, the third segment width W3, and other segment widths may be in a range from about 1 μm to about 500 μm, which is based on the respective gap widths, for example, each gap width may be in a range from about 0.01 μm to about 5 μm. In addition, the first segment width W1, the second segment width W2, the third segment width W3 and other segment widths may be the same as or different from each other based on the electrical requirements of the HEMT structures. Moreover, the effect of required lateral depletion for the HEMT structure 100 is achieved by adjusting the segment width based on the gap width. Furthermore, in the embodiments of the present disclosure, each segment width and each gap width may be adjusted according to various electrical requirements (such as the pinch-off voltage, the threshold voltage, the drain current, etc.) of the HEMT structure 100, so that the HEMT structure 100 has more flexibility of products. In some embodiments, in the first direction (for example, the X-axis direction), the first gap width S1 is about 0.01 μm to about 0.5 μm, and the ratio of the first segment width W1 to the first gap width S1 may be in a range from 5 to 200. In some embodiments, the second segment width W2 may be less than or equal to the first segment width W1, and the first gap width S1 and the second gap width S2 may be respectively in a range from about 0.01 μm to about 0.5 μm. The ratio of the second segment width W2 to the first gap width S1 or the second gap width S2 may be in a range from 5 to 200. In addition, the ratio of the third segment width W3 to the second gap width S2 may be in a range from 5 to 200.

Still referring to FIG. 1, the HEMT structure 100 further includes a gate electrode 109 disposed on the cap layer 107. In some embodiments, the gate electrode 109 may continuously cover the first segment 107-1, the first gap 108-1, the second segment 107-2, the second gap 108-2, the third segment 107-3, other segments, and other gaps of the cap layer 107. In other embodiments, the gate electrode 109 may include a plurality of portions separated from each other along the first direction (for example, the X-axis direction). These portions of the gate electrode 109 are disposed directly above and respectively correspond to the first segment 107-1, the second segment 107-2, the third segment 107-3, and other segments of the cap layer 107. In addition, the HEMT structure 100 includes a source electrode 111 and a drain electrode 113 disposed on the barrier layer 105. The source electrode 111 and the drain electrode 113 are arranged along a second direction (for example, the Y-axis direction), and are respectively located on two opposite sides of the cap layer 107, and are respectively located on two opposite sides of the gate electrode 109. The long axes of the source electrode 111 and the drain electrode 113 are respectively extended along the first direction (for example, the X-axis direction) to be a continuous electrode pattern.

Figure 2:
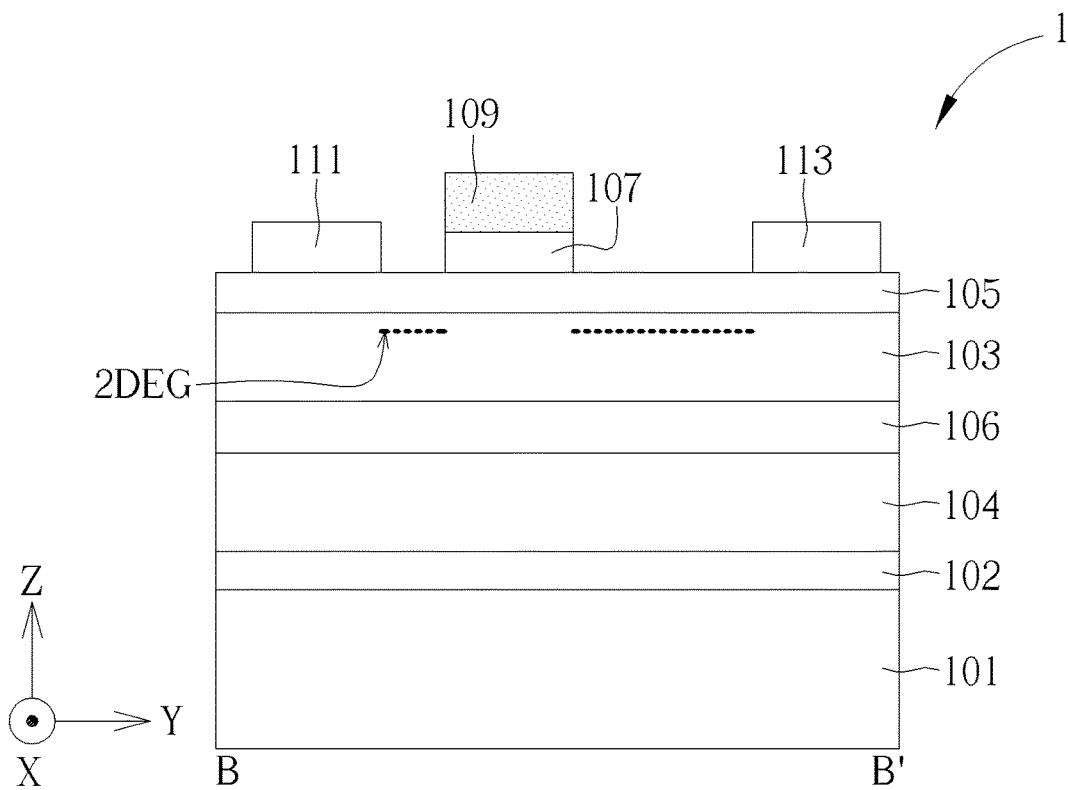
FIG. 2 is a schematic cross-sectional view of a HEMT structure along the line B-B' in FIG. 1 according to an embodiment of the present disclosure.

FIG. 2 is a schematic cross-sectional view of a HEMT structure along the line B-B' in FIG. 1 according to an embodiment of the present disclosure. As shown in FIG. 2, in some embodiments, the HEMT structure 100 further includes a nucleation layer 102, a buffer layer 104 and a high resistance layer 106 (or referred to as an electrical isolation layer) stacked on the substrate 101 in order from bottom to top. The materials of the nucleation layer 102, the buffer layer 104 and the high resistance layer 106 include compound semiconductors. In some embodiments, the nucleation layer 102 is, for example, an aluminum nitride (AlN) layer. The buffer layer 104 may be a superlattice (SL) structure, for example, including a plurality of alternately stacked aluminum gallium nitride (AlGaN) layers and aluminum nitride (AlN) layers. The high resistance layer 106 is, for example, a carbon-doped gallium nitride (C—GaN) layer. The aforementioned materials of the nucleation layer 102, the buffer layer 104 and the high resistance layer 106 are for example, but not limited thereto. In addition, the HEMT structure 100 includes a compound semiconductor channel layer 103 (hereinafter referred to as a channel layer) disposed between the high resistance layer 106 and the barrier layer 105. In some embodiments, the channel layer 103 is such as an undoped compound semiconductor layer, for example, an undoped gallium nitride (u-GaN) layer. The barrier layer 105 is a compound semiconductor layer with an energy gap larger than that of the channel layer 103, for example, an aluminum gallium nitride (AlGaN) layer. The cap layer 107 is such as a p-type compound semiconductor layer, for example, a p-type gallium nitride (p-GaN) layer. The aforementioned materials of the channel layer 103, the barrier layer 105 and the cap layer 107 are for example, but not limited thereto. The compositions and structural arrangements of the compound semiconductor layers of the HEMT structure 100 are determined according to the requirements of various semiconductor devices using the HEMT structure 100.

As shown in FIG. 2, the gate electrode 109 is disposed on the cap layer 107. The source electrode 111 and the drain electrode 113 are disposed on the barrier layer 105, and respectively located on two opposite sides of the gate electrode 109. The distance between the drain electrode 113 and gate electrode 109 may be greater than the distance between source electrode 111 and gate electrode 109. The channel layer 103 and the barrier layer 105 are extended along the second direction (for example, the Y-axis direction) between the source electrode 111 and the drain electrode 113. Since there is a discontinuous energy gap between the channel layer 103 and the barrier layer 105, by stacking the channel layer 103 and the barrier layer 105 with each other, electrons will be gathered at the heterojunction between the channel layer 103 and the barrier layer 105 due to the piezoelectric effect, thereby producing a thin layer with high electron mobility, i.e., a two-dimensional electron gas region 2DEG. In addition, the materials of the gate electrode 109, the source electrode 111 and the drain electrode 113 may include conductive materials such as metals, alloys, metal nitrides or semiconductor materials. In some embodiments, the metal may include gold (Au), nickel (Ni), platinum (Pt), palladium (Pd), iridium (Ir), titanium (Ti), chromium (Cr), tungsten (W), aluminum (Al), copper (Cu), molybdenum (Mo), other suitable metals, or a combination thereof. The gate electrode 109 may produce a Schottky contact with the cap layer 107. The source electrode 111 and the drain electrode 113 may produce an ohmic contact with the underlying semiconductor layer such as the channel layer 103 and the barrier layer 105.

For an E-mode (or referred to as normally-off) HEMT, when no voltage is applied to the gate electrode 109, the region covered by the cap layer 107 does not form a two-dimensional electron gas (as shown in FIG. 2) and is regarded as a 2DEG cut-off region, so that there is no conduction between the source electrode 111 and the drain electrode 113. When a positive voltage is applied to the gate electrode 109, the region covered by the cap layer 107 will form a two-dimensional electron gas, so that a continuous two-dimensional electron gas region is generated between the source electrode 111 and the drain electrode 113 to make conduction between the source electrode 111 and the drain electrode 113.

In addition, for a D-mode (or referred to as normally-on) HEMT, when no voltage or only a weak positive voltage is applied to the gate electrode 109, the region not covered by the cap layer 107 still forms a two-dimensional electron gas, so that the region between the source electrode 111 and the drain electrode 113 will generate a continuous two-dimensional electron gas region to make conduction between the source electrode 111 and the drain electrode 113. When a negative voltage is applied to the gate electrode 109, the two-dimensional electron gas in the region not covered by the cap layer 107 will be cut-off, which is regarded as a 2DEG cut-off region, so that there is no conduction between the source electrode 111 and the drain electrode 113.

Figure 3:
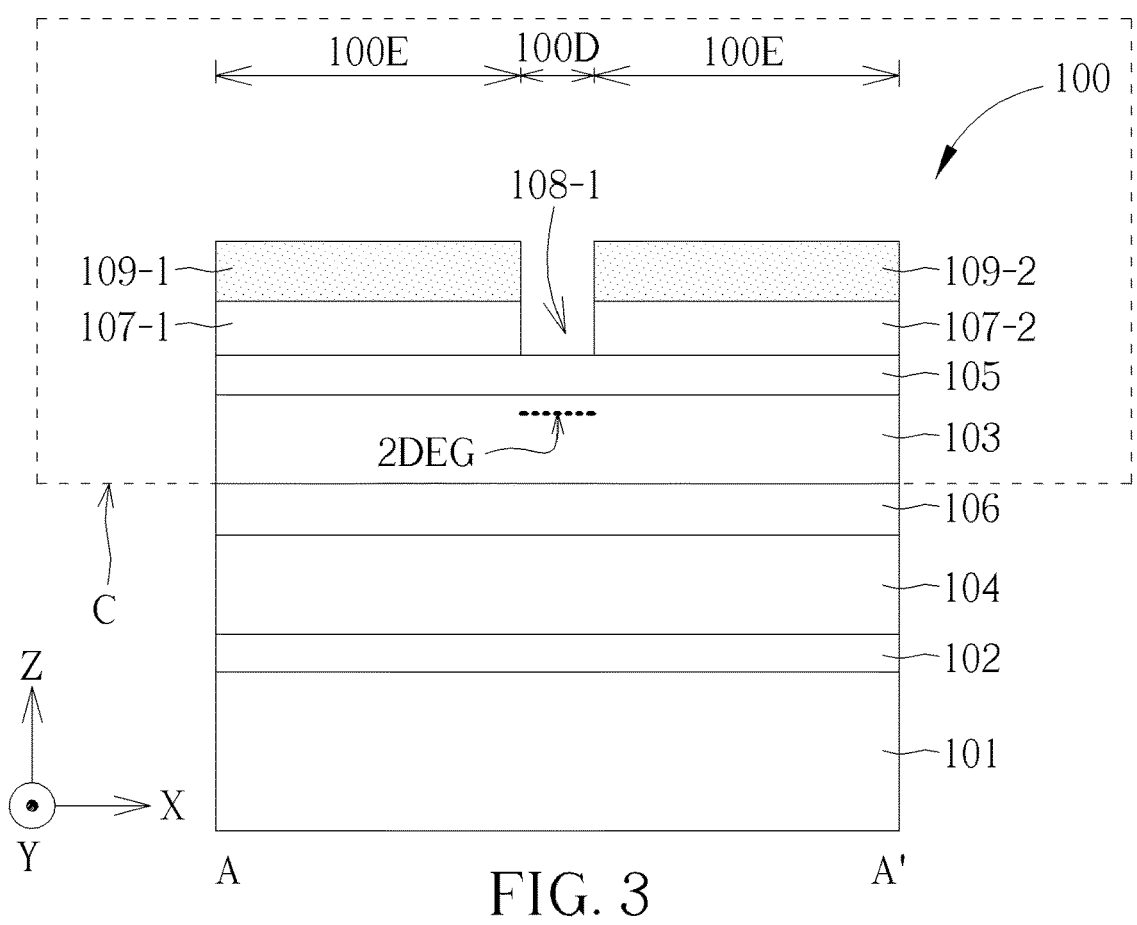
FIG. 3 is a schematic cross-sectional view of a HEMT structure along the line A-A' in FIG. 1 according to an embodiment of the present disclosure.

FIG. 3 is a schematic cross-sectional view of a HEMT structure along the line A-A' in FIG. 1 according to an embodiment of the present disclosure. As shown in FIG. 3, the HEMT structure 100 includes an enhancement-mode (E-mode) region 100E corresponding to each segment of the cap layer 107, such as the first segment 107-1 and the second segment 107-2, and a depletion-mode (D-mode) region 100D corresponding to the gap between the segments of the cap layer 107, for example, the first gap 108-1. According to the embodiments of the present disclosure, when no voltage is applied to the gate electrode 109, a two-dimensional electron gas region 2DEG is generated at the heterojunction between the channel layer 103 and the barrier layer 105 in the D-mode region 100D, and no 2DEG region is generated at the heterojunction between the channel layer 103 and the barrier layer 105 in the E-mode the region 100E. In addition, in this embodiment, the gate electrode 109 includes a plurality of portions separated from each other, such as a first portion 109-1 and a second portion 109-2. Theses portions of the gate electrode 109 are disposed directly above and respectively correspond to the first segment 107-1 and the second segment 107-2 of the cap layer 107. In addition, the first gap 108-1 is not filled up with the gate electrode 109.

Please refer to FIG. 1 and FIG. 3, according to the embodiments of the present disclosure, during the operation of the HEMT structure 100, when no voltage or only a weak positive voltage is applied to the gate electrode 109, and a positive voltage is applied to the drain electrode 113, the current flows from the drain electrode 113, passes through the two-dimensional electron gas region 2DEG below the first gap 108-1, and then flows to the source electrode 111, so that the HEMT structure 100 is in an on-state.

In contrast, when a sufficient negative voltage is applied to the gate electrode 109, it will generate an electric field to the two-dimensional electron gas region 2DEG below the first gap 108-1, so that the two-dimensional electron gas region 2DEG below the first gap 108-1 is disappeared due to the influence of the electric field. Therefore, even if a positive voltage is applied to the drain electrode 113, the current still cannot flow from the drain electrode 113 to the source electrode 111 through the region below the first gap 108-1, so that the HEMT structure 100 is in an off-state.

Therefore, according to the HEMT structures 100 of the embodiments of the present disclosure, by using the layout of the cap layer 107 in the E-mode region 100E and the D-mode region 100D, the regions of the channel layer 103 directly below the first segment 107-1 and the second segment 107-2 of the cap layer 107 constitute the channel region of an E-mode HEMT, and the other region of the channel layer 103 directly below the first gap 108-1 of the cap layer 107 constitutes the channel region of a D-mode HEMT or a junction field effect transistor (JFET), so that the HEMT structures 100 of the present disclosure achieve the effect of lateral depletion to provide a start-up function in the applications of AC/DC power converters and drivers.

Figure 4:
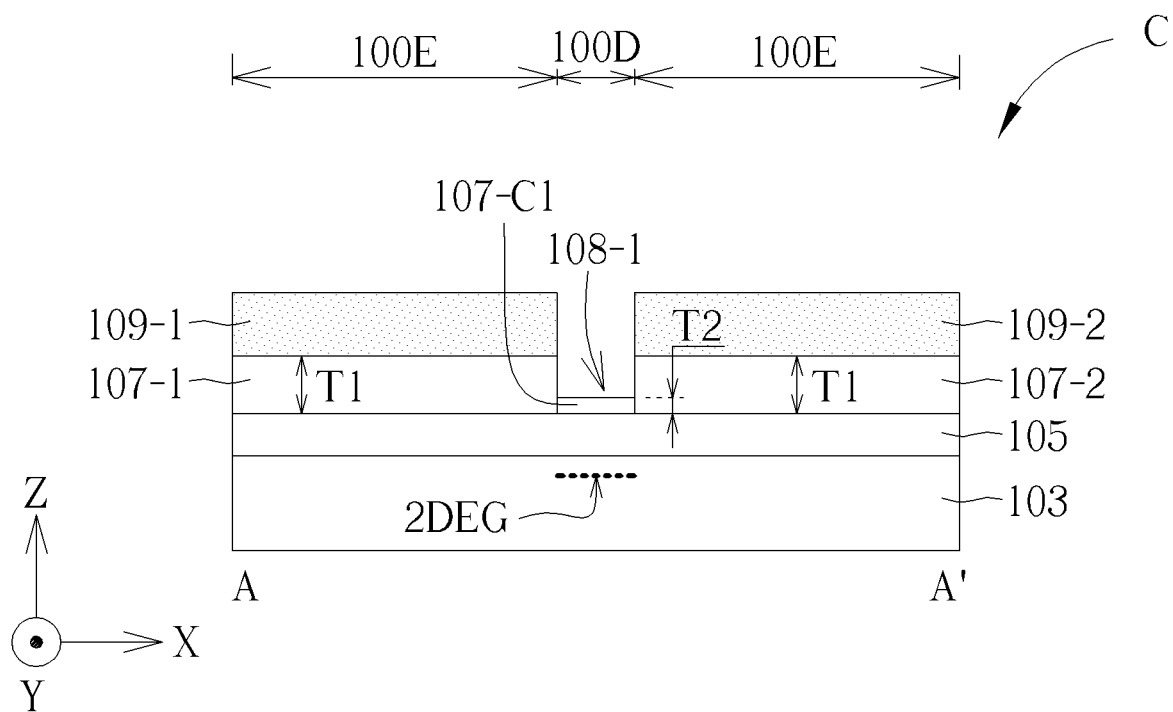
FIG. 4 is a schematic cross-sectional view of a portion of a HEMT structure along the line A-A' in FIG. 1 according to another embodiment of the present disclosure.

FIG. 4 is a schematic cross-sectional view of a portion of a HEMT structure along the line A-A' in FIG. 1 according to another embodiment of the present disclosure, which shows another structure of the region C in FIG. 3. According to the embodiments of the present disclosure, the structure of the region C shown in FIG. 3, FIG. 4 and FIG. 5 may be regarded as a repeating unit of the HEMT structure 100. The repeating unit is arranged repeatedly along the first direction (for example, the X-axis direction) on the substrate 101 to construct the HEMT structure. Referring to FIG. 4, in this embodiment, the cap layer 107 may further include a first connecting portion 107-C1 disposed between the first segment 107-1 and the second segment 107-2. The thickness T2 of the first connecting portion 107-C1 is smaller than the respective thicknesses T1 of the first segment 107-1 and the second segment 107-2. In some embodiments, the thickness T2 of the first connecting portion 107-C1 is between about 10 nanometers (nm) and about 100 nm, and the respective thicknesses T1 of the first segment 107-1 and the second segment 107-2 are between about 50 nm and about 150 nm. According to some embodiments of the present disclosure, since the thickness T2 of the first connection portion 107-C1 is about 5% to 70% of the respective thicknesses T1 of the first segment 107-1 and the second segment 107-2, the first connecting portion 107-C1 does not make the two-dimensional electron gas region 2DEG directly below the first gap 108-1 to be completely cut-off. Since the first gap 108-1 still has enough space between the first segment 107-1 and the second segment 107-2, when a sufficient negative voltage is applied to the gate electrode 109, the two-dimensional electron gas region 2DEG directly below the first gap 108-1 and the first connecting portion 107-C1 will still be affected by the electric field from the gate electrode 109 to be disappeared. Therefore, even if a positive voltage is applied to the drain electrode 113, the current cannot flow from the drain electrode 113 to the source electrode 111 through the channel layer 103 below the first gap 108-1 and the first connecting portion 107-C1. Accordingly, the HEMT structure 100 is still in an off-state, and has a start-up function similar to that provided by D-mode HEMT or junction field effect transistor (JFET). In addition, as shown in FIG. 4, in this embodiment, the gate electrode 109 includes a plurality of portions separated from each other, such as the first portion 109-1 and the second portion 109-2. Theses portions of the gate electrode 109 respectively correspond to and are disposed directly above the first segment 107-1 and the second segment 107-2 of the cap layer 107. In addition, the first gap 108-1 is not filled up with the gate electrode 109, i.e., the gate electrode 109 does not cover the first connecting portion 107-C1. Moreover, referring to FIG. 1 and FIG. 4, a second connecting portion (not shown) may also be disposed between the second segment 107-2 and the third segment 107-3 of the cap layer 107. The thickness of the second connecting portion is smaller than the respective thicknesses of the second segment 107-2 and the third segment 107-3. In some embodiments, the thicknesses of the first connecting portion 107-C1 and the second connecting portion may be the same as or different from each other according to the electrical requirements of the HEMT structure 100.

Figure 5:
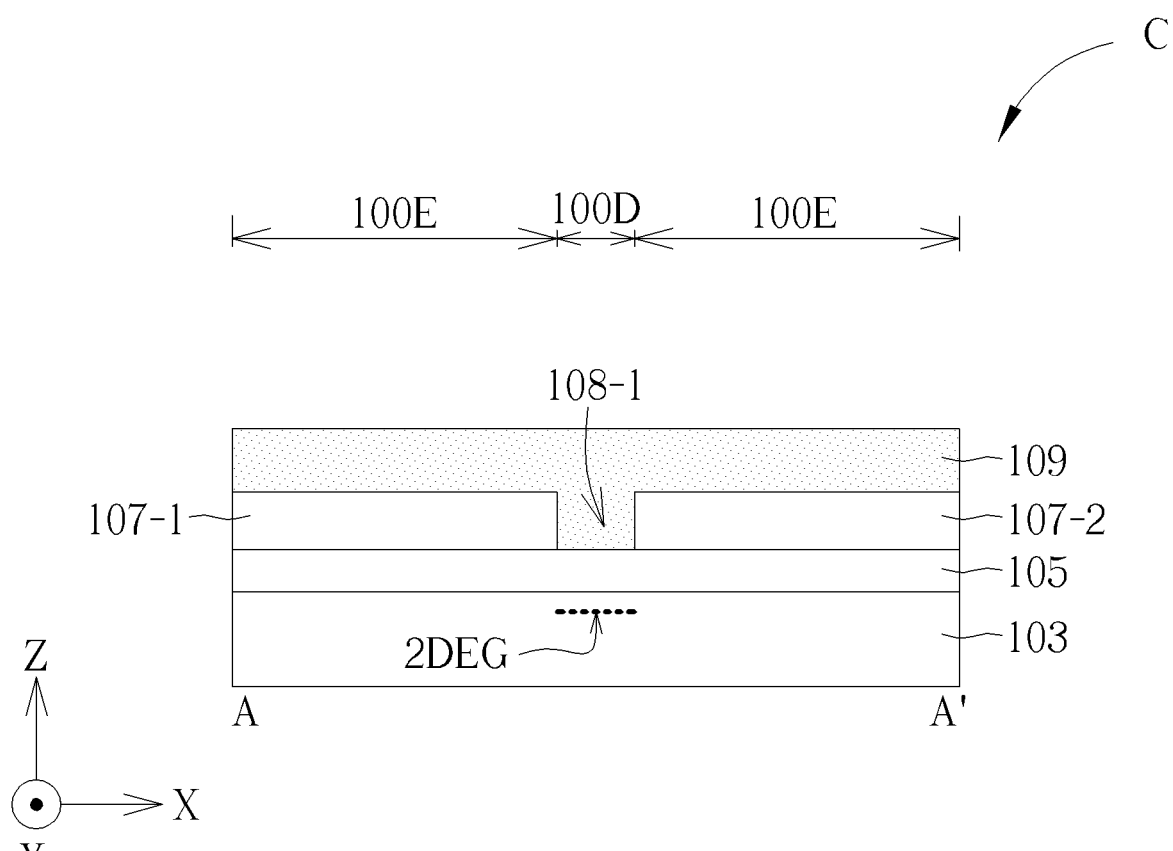
FIG. 5 is a schematic cross-sectional view of a portion of a HEMT structure along the line A-A' in FIG. 1 according to further another embodiment of the present disclosure.

FIG. 5 is a schematic cross-sectional view of a portion of a HEMT structure along the line A-A' in FIG. 1 according to further another embodiment of the present disclosure, which shows another structure of the region C in FIG. 3. In this embodiment, a partial surface of the barrier layer 105 is exposed through the first gap 108-1, and the gate electrode 109 continuously covers the first segment 107-1 of the cap layer 107, the aforementioned partial surface of the barrier layer 105, and the second segment 107-2 of the cap layer 107. In one embodiment, the gate electrode 109 may fill up the first gap 108-1 and have a flat top surface. In another embodiment, the gate electrode 109 may be conformally formed on the sidewalls and the bottom surface of the first gap 108-1, and have a top surface with a concave-convex profile.

Figure 6:
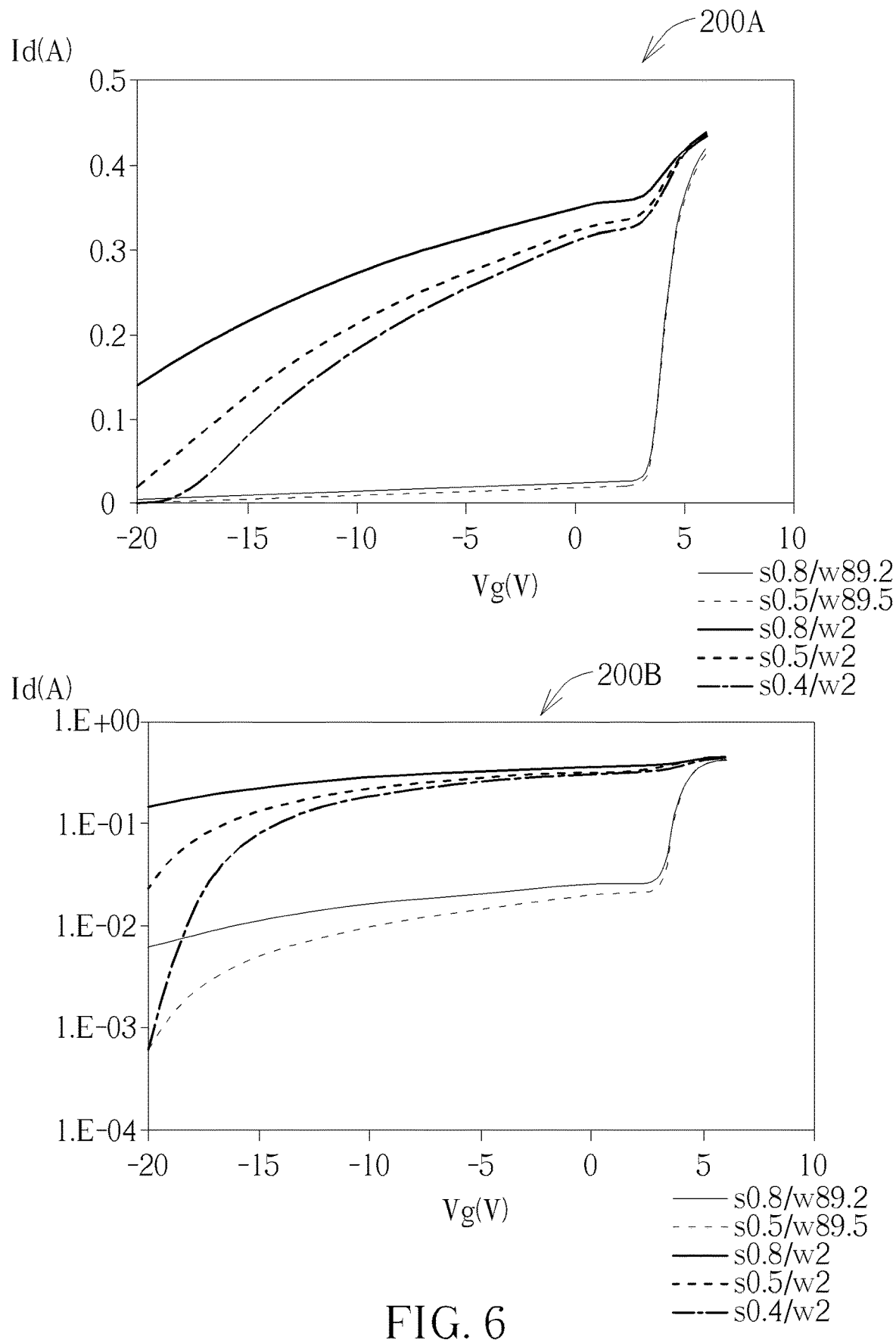
FIG. 6 is graphs showing the drain current versus the gate voltage of various HEMT structures according to some embodiments of the present disclosure, where the drain current in a graph 200B is the exponential form of the drain current in a graph 200A.

FIG. 6 is graphs showing the drain current versus the gate voltage of HEMT structures according to some embodiments of the present disclosure. The vertical axis is the drain current Id with a unit of ampere (A), and the horizontal axis is the gate voltage Vg with a unit of volts (V). The drain current of the graph 200B is the drain current of the graph 200A represented in an exponential form, so that the change of the drain current Id of each curved line in the graph 200B within the range from 0 A to 0.2 A is easier observed than that in the graph 200A. The curved lines of FIG. 6 respectively represent the characteristics of the drain current corresponding to the gate voltage of the HEMT structures of some embodiments, where the respective cap layers 107 thereof have different sizes in the gap width S and the segment width W. The units of the gap width S and the segment width W of the cap layer 107 in these embodiments are micrometers (μm). The gap width S and the segment width W of the embodiments in FIG. 6 are respectively S=0.8/W=89.2, S=0.5/W=89.5, S=0.8/W=2, S=0.5/W=2, and S=0.4/W=2. As shown in the graphs 200A and 200B of FIG. 6, it is known that the cap layers of the HEMT structures with a larger segment width W (for example, W=89.2, W=89.5) make the drain current be cut-off quickly while less negative voltage is applied to the gate electrode. The cap layers of the HEMT structures with a smaller gap width S (for example, S=0.4, S=0.5) make the cut-off drain current be reduced to a lower value while the same negative voltage is applied to the gate electrode. Therefore, according to the embodiments of the present disclosure, the HEMT structures may have different electrical characteristics by adjusting the gap width and the segment width of the cap layer, thereby improving the flexibility of the HEMT structures in application to different electronic products.

Figure 7:
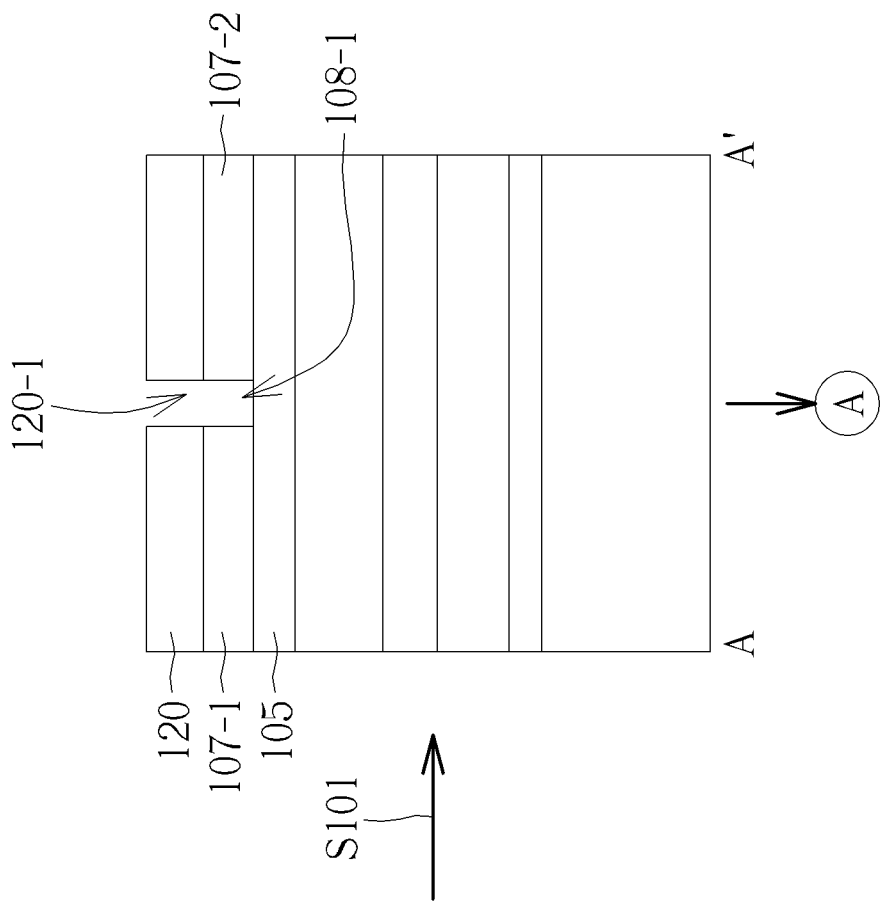
FIG. 7 and FIG. 8 are schematic cross-sectional views of some stages of a fabrication method of a HEMT structure along the line A-A' in FIG. 1 according to an embodiment of the present disclosure.
Figure 7:
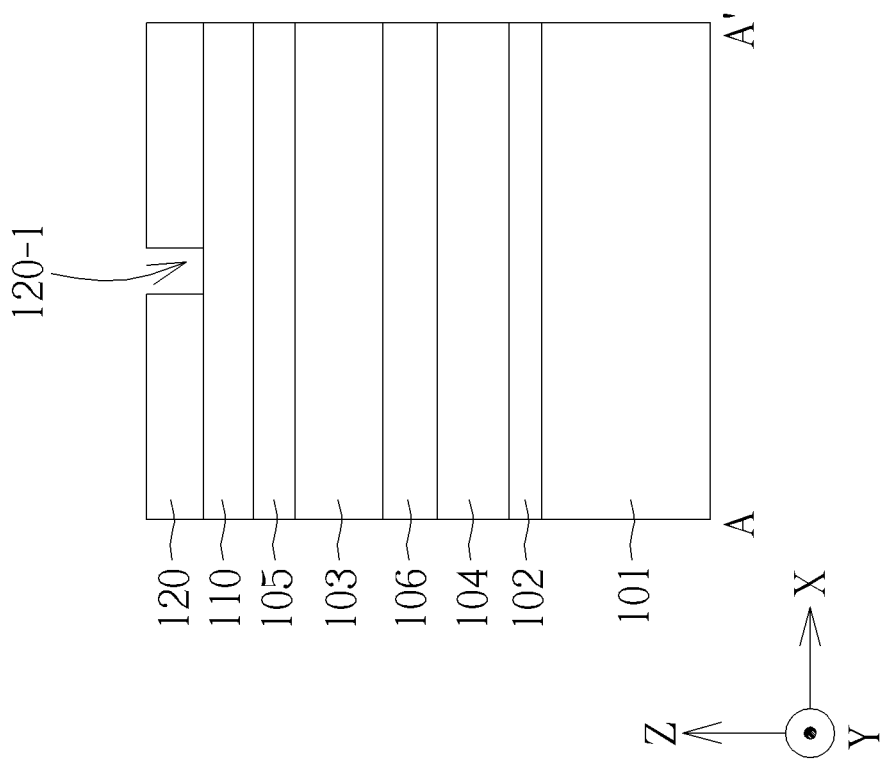
Figure 8:
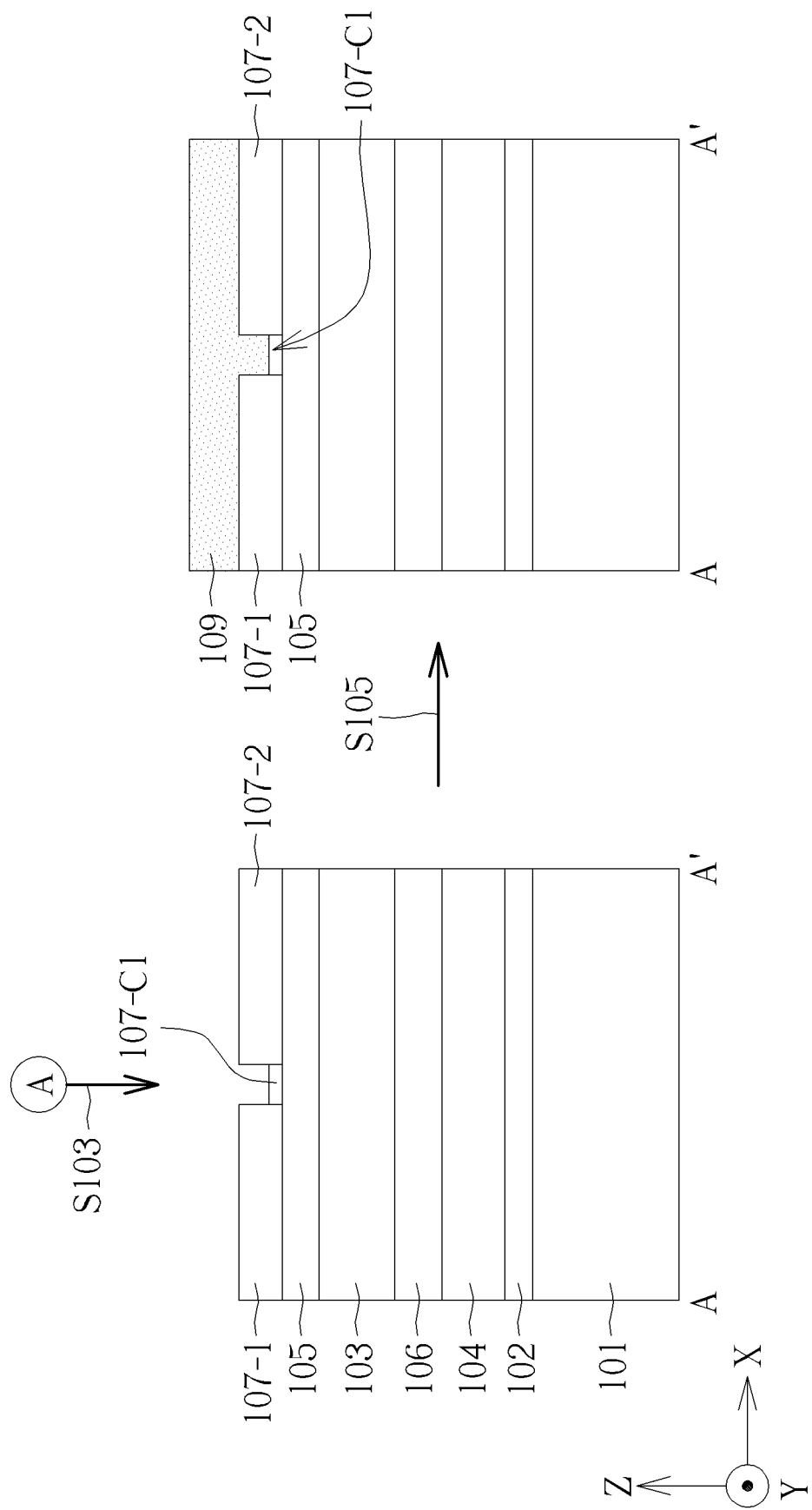

FIG. 7 and FIG. 8 are schematic cross-sectional views of some stages of a fabrication method of a HEMT structure along the line A-A' in FIG. 1 according to an embodiment of the present disclosure. As shown in FIG. 7, firstly, a nucleation layer 102, a buffer layer 104, a high resistance layer 106, a channel layer 103, a barrier layer 105 and a compound semiconductor material layer 110 are sequentially stacked on a substrate 101. The compound semiconductor material layer 110 is used to form a cap layer 107 in the subsequent process. The materials of the aforementioned layers are all compound semiconductors and the compositions thereof may refer to the aforementioned description of FIG. 2. The aforementioned layers may be formed in sequence on the substrate 101 from bottom to top by using different epitaxial growth processes. Next, a patterned photoresist 120 is formed on the compound semiconductor material layer 110. The patterned photoresist 120 has an opening 120-1 corresponding to a predetermined region of a gap of the cap layer 107, such as a first gap 108-1.

Still referring to FIG. 7, at step S101, an etching process is used to make an etchant pass through the opening 120-1 of the patterned photoresist 120 to completely remove a portion of the compound semiconductor material layer 110 not covered by the patterned photoresist 120, thereby forming each segment and each gap of the cap layer 107, such as a first segment 107-1, a second segment 107-2, and a first gap 108-1.

Next, referring to FIG. 8, at step S103, an epitaxial growth process is used to epitaxially grow a compound semiconductor material in the first gap 108-1, thereby forming each connecting portion of the cap layer 107, for example, a first connecting portion 107-C1. The thickness of the first connecting portion 107-C1 is smaller than the respective thicknesses of the first segment 107-1 and the second segment 107-2. Afterwards, at step S105, a gate electrode 109 is formed on the cap layer 107 by deposition, photolithography and etching processes. In this embodiment, the gate electrode 109 continuously covers the first segment 107-1, the first connecting portion 107-C1 and the second segment 107-2, and fills up the first gap 108-1 of the cap layer 107, so that the gate electrode 109 has a flat top surface. Then, referring to FIG. 1, the source electrode 111 and the drain electrode 113 are formed on the barrier layer 105 to complete the HEMT structure 100.

Figure 9:
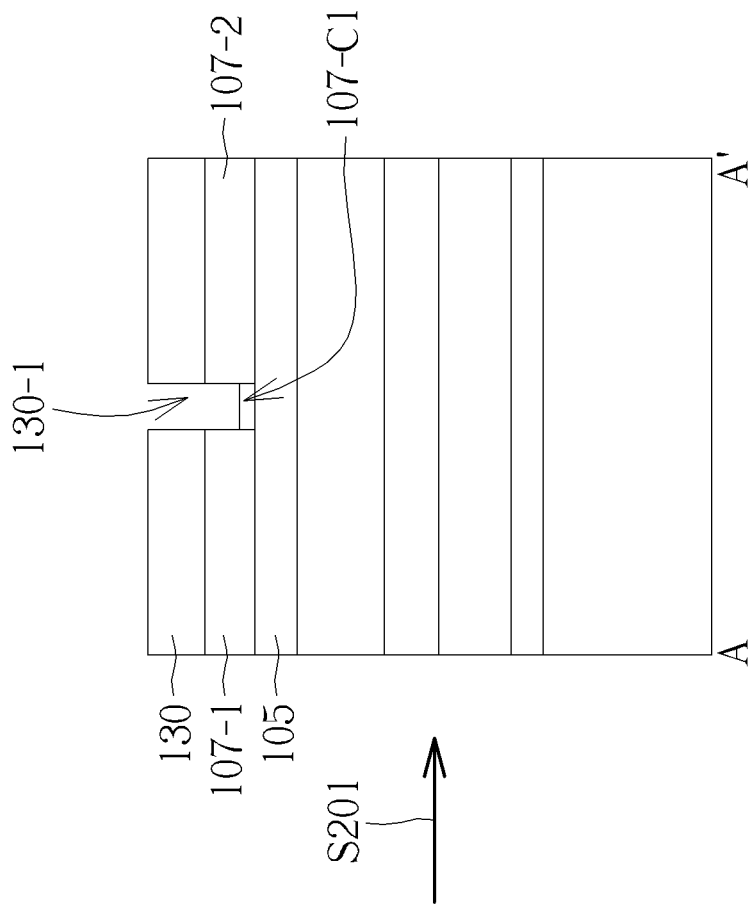
FIG. 9 is a schematic cross-sectional view of an intermediate stage of a fabrication method of a HEMT structure along the line A-A' in FIG. 1 according to another embodiment of the present disclosure.
Figure 9:
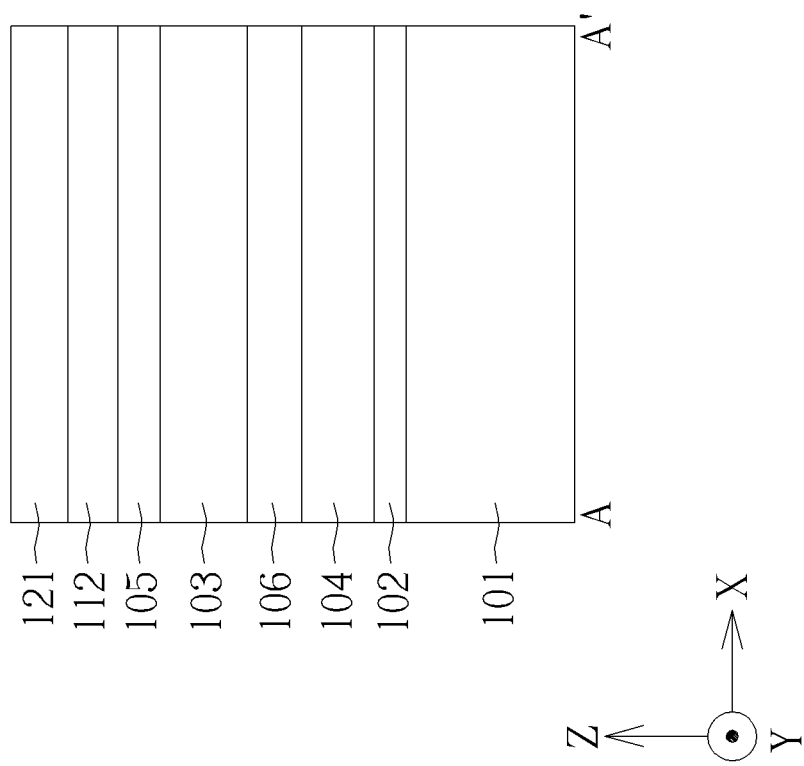

FIG. 9 is a schematic cross-sectional view of an intermediate stage of a fabrication method of a HEMT structure along the line A-A' in FIG. 1 according to another embodiment of the present disclosure. Firstly, referring to FIG. 7, a nucleation layer 102, a buffer layer 104, a high resistance layer 106, a channel layer 103, a barrier layer 105, and a compound semiconductor material layer 110 are sequentially stacked on a substrate 101. The compound semiconductor material layer 110 is used to form a cap layer 107 in the subsequent process. The materials of the aforementioned layers are compound semiconductors and the compositions thereof may refer to the aforementioned description of FIG. 2. The aforementioned layers may be formed in sequence on the substrate 101 from bottom to top by using different epitaxial growth processes. Next, referring to FIG. 7 and FIG. 9, a first patterned photoresist 121 is formed on the compound semiconductor material layer 110. Then, an etching process is used to remove a portion of the compound semiconductor material layer 110 not covered by the first patterned photoresist 121, thereby forming a patterned compound semiconductor material block 112. The pattern of the patterned compound semiconductor material block 112 corresponds to the outline of each segment of the cap layer 107 shown in FIG. 1 connected with each other by each connecting portion.

Still referring to FIG. 9, at step S201, firstly, the first patterned photoresist 121 is removed, and then a second patterned photoresist 130 is formed on the patterned compound semiconductor material block 112. The second patterned photoresist 130 has an opening 130-1 corresponding to a predetermined region of a gap of the cap layer 107, such as a first gap 108-1. Then, an etching process is used to make an etchant pass through the opening 130-1 of the second patterned photoresist 130 to remove an upper portion of the patterned compound semiconductor material block 112 exposed through the opening 130-1, thereby forming a connecting portion of the cap layer 107, for example, a first connecting portion 107-C1. Afterwards, the second patterned photoresist 130 is removed. Then, referring to FIG. 1 and FIG. 8, the gate electrode 109 is formed on the cap layer 107, and the source electrode 111 and the drain electrode 113 are formed on the barrier layer 105 to complete the HEMT structure 100.

The HEMT structures of the embodiments of the present disclosure integrate the E-mode HEMT and the D-mode HEMT by using the layout of the compound semiconductor cap layer without additional process steps, thereby achieving the effect of lateral depletion. Therefore, the HEMT structures of the present disclosure have the start-up function the same as that provided by junction field effect transistors or D-mode field effect transistors. In addition, according to the HEMT structures of the present disclosure, the threshold voltage (Vt) of the D-mode HEMT is stably and precisely controlled by adjusting the gap width between the segments of the compound semiconductor cap layer. Compared with the conventional D-mode MISFETs, the HEMT structures of the present disclosure do not need to form a gate recess and a gate dielectric layer, thereby precisely controlling the threshold voltage (Vt) of the devices and avoiding the interface traps between the gate dielectric layer and the semiconductor layer of the conventional D-mode MISFETs. Therefore, the electrical performances and the reliability of the semiconductor devices using the HEMT structures of the present disclosure are improved. In addition, the fabricating processes of the HEMT structures of the present disclosure are compatible with the existing HEMT fabricating processes, thereby reducing the manufacturing cost thereof. Moreover, the HEMT structures of the present disclosure may be fabricated together with other HEMTs on the same wafer at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT) structure, comprising:
   a compound semiconductor channel layer, disposed on a substrate;
   a compound semiconductor barrier layer, disposed on the compound semiconductor channel layer;
   a compound semiconductor cap layer, disposed on the compound semiconductor barrier layer, and comprising a first segment and a second segment arranged along a first direction, and a first gap between the first segment and the second segment along the first direction;
   a gate electrode, disposed on the compound semiconductor cap layer, and overlying entire top surfaces of the first segment and the second segment of the compound semiconductor cap layer in a top view; and
   a source electrode and a drain electrode, disposed on the compound semiconductor barrier layer, arranged along a second direction not parallel to the first direction in the top view, and respectively located on two sides of the compound semiconductor cap layer, wherein each of the source electrode and the drain electrode includes a long-axis parallel to the first direction in the top view.

2. The HEMT structure of claim 1, wherein a region of the compound semiconductor channel layer directly below the first segment and the second segment constitutes a channel region of an enhancement-mode HEMT, and another region of the compound semiconductor channel layer directly below the first gap constitutes a channel region of a depletion-mode HEMT or a junction field effect transistor.

3. The HEMT structure of claim 1, wherein a width of the first gap in the first direction is between 0.01 µm and 5 µm.

4. The HEMT structure of claim 1, wherein in the first direction, a width of the first gap is between 0.01 µm and 0.5 µm, and a ratio of the width of the first segment to the width of the first gap is between 5 and 200, a width of the second segment is less than or equal to the width of the first segment, and a ratio of the width of the second segment to the width of the first gap is between 5 and 200.

5. The HEMT structure of claim 1, wherein the gate electrode comprises a first portion and a second portion separated from each other along the first direction, and the first portion and the second portion are respectively disposed directly above the first segment and the second segment of the compound semiconductor cap layer.

6. The HEMT structure of claim 1, wherein a partial surface of the compound semiconductor barrier layer is exposed through the first gap, and the gate electrode continuously covers the first segment, the partial surface and the second segment.

7. The HEMT structure of claim 6, wherein the gate electrode fills up the first gap and has a flat top surface.

8. The HEMT structure of claim 1, wherein the compound semiconductor cap layer further comprises a first connecting portion disposed between the first segment and the second segment, and the thickness of the first connecting portion is smaller than the respective thicknesses of the first segment and the second segment.

9. The HEMT structure of claim 8, wherein the thickness of the first connecting portion is 5% to 70% of the respective thicknesses of the first segment and the second segment.

10. The HEMT structure of claim 8, wherein the gate electrode continuously covers the first segment, the first connecting portion and the second segment.

11. The HEMT structure of claim 1, wherein the compound semiconductor cap layer further comprises a third segment arranged on one side of the second segment along the first direction, and a second gap disposed between the third segment and the second segment, in the first direction, a width of the second gap is between 0.01 μm and 0.5 μm, and a ratio of a width of the third segment to the width of the second gap is between 5 and 200.

12. The HEMT structure of claim 11, wherein the compound semiconductor cap layer further comprises a second connecting portion disposed between the second segment and the third segment, and a thickness of the second connecting portion is less than the respective thicknesses of the second segment and the third segment.

13. The HEMT structure of claim 11, wherein the gate electrode continuously covers the first segment, the first gap, the second segment, the second gap and the third segment.

14. The HEMT structure of claim 11, wherein the gate electrode comprises a first portion, a second portion and a third portion separated from each other along the first direction, and the first portion, the second portion and the third portion are respectively disposed directly above the first segment, the second segment and the third segment.

15. The HEMT structure of claim 1, wherein the compound semiconductor channel layer and the compound semiconductor barrier layer are extended along the second direction between the source electrode and the drain electrode.

* * * * *